US011955878B2

(12) United States Patent
Iesaka et al.

(10) Patent No.: US 11,955,878 B2
(45) Date of Patent: Apr. 9, 2024

(54) UPPER ARM DRIVE CIRCUIT, DRIVE CIRCUIT OF POWER CONVERSION DEVICE, AND POWER CONVERSION DEVICE

(71) Applicant: Hitachi Power Semiconductor Device, Ltd., Hitachi (JP)

(72) Inventors: Satoshi Iesaka, Hitachi (JP); Kenji Sakurai, Hitachi (JP)

(73) Assignee: Hitachi Power Semiconductor Device, Ltd., Ibaraki (JP)

( * ) Notice: Subject to any disclaimer, the term of this patent is extended or adjusted under 35 U.S.C. 154(b) by 307 days.

(21) Appl. No.: 17/578,044

(22) Filed: Jan. 18, 2022

(65) Prior Publication Data

US 2022/0302855 A1 Sep. 22, 2022

(30) Foreign Application Priority Data

Mar. 22, 2021 (JP) ................................ 2021-047525

(51) Int. Cl.
*H02M 1/08* (2006.01)
*H02M 7/5387* (2007.01)

(52) U.S. Cl.
CPC ......... *H02M 1/08* (2013.01); *H02M 7/53873* (2013.01)

(58) Field of Classification Search
CPC .. H02M 1/08; H02M 7/5387; H02M 7/53871; H02M 7/53873
See application file for complete search history.

(56) References Cited

U.S. PATENT DOCUMENTS

| | | | |
|---|---|---|---|
| 5,351,182 | A | 9/1994 | Miyazaki et al. |
| 5,818,281 | A | 10/1998 | Ohura et al. |
| 6,326,831 | B1 | 12/2001 | Kumagai |

(Continued)

FOREIGN PATENT DOCUMENTS

| | | | |
|---|---|---|---|
| CN | 105322944 | A | 2/2016 |
| JP | H06-153533 | A | 5/1994 |

(Continued)

OTHER PUBLICATIONS

Examination Report, dated Oct. 7, 2022, for Indian Application No. 202214008206 (with English translation).

(Continued)

*Primary Examiner* — Alex Torres-Rivera
(74) *Attorney, Agent, or Firm* — BAKER BOTTS L.L.P.

(57) ABSTRACT

The upper arm drive circuit for controlling the drive of an upper arm switching element of the power conversion device includes: an upper arm gate voltage output wiring connected to a gate of the upper arm switching element; a first upper arm drive circuit reference potential wiring; an upper arm gate voltage reference potential wiring connected to an inverter output of the power conversion device; and a control circuit of upper arm drive circuit reference potential wiring potential for controlling the potential of the first upper arm drive circuit reference potential wiring to a potential lower than a reference potential when a potential of the inverter output is equal to a predefined potential that is lower than the reference potential or lower. The first upper arm drive circuit reference potential wiring is connected to the reference potential via the control circuit of upper arm drive circuit reference potential wiring potential.

16 Claims, 8 Drawing Sheets

(56) References Cited

U.S. PATENT DOCUMENTS

| | | | | |
|---|---|---|---|---|
| 2005/0144539 | A1 | 6/2005 | Orita et al. | |
| 2010/0066175 | A1* | 3/2010 | Jansen | H02M 1/08 307/89 |
| 2016/0020685 | A1 | 1/2016 | Kanno et al. | |
| 2016/0036433 | A1 | 2/2016 | Toshiyuki et al. | |
| 2016/0164413 | A1* | 6/2016 | Akiyama | H02M 3/158 323/271 |
| 2018/0294709 | A1 | 10/2018 | Araki | |
| 2021/0057906 | A1 | 2/2021 | Kim et al. | |
| 2022/0069695 | A1* | 3/2022 | Sano | H02M 1/08 |

FOREIGN PATENT DOCUMENTS

| | | | |
|---|---|---|---|
| JP | H08-088550 | A | 4/1996 |
| JP | 2005-051821 | A | 2/2005 |
| JP | 2005-143226 | A | 6/2005 |
| JP | 2019-054384 | A | 4/2019 |
| JP | 2019-134595 | A | 8/2019 |
| KR | 10-2005-0059987 | A | 6/2005 |
| KR | 10-2015-0133253 | A | 11/2015 |
| KR | 10-2021-0023033 | A | 3/2021 |

OTHER PUBLICATIONS

Notice of Reasons for Refusal, dated Sep. 19, 2023, for Japanese Application No. 2021-047525 (with English translation).

Request for the Submission of an Opinion, mailed May 3, 2023, for Korean Application No. 10-2022-0005766 (with English translation).

* cited by examiner

UPPER ARM DRIVE CIRCUIT, DRIVE CIRCUIT OF POWER CONVERSION DEVICE, AND POWER CONVERSION DEVICE

CLAIM OF PRIORITY

The present application claims priority from Japanese Patent application serial no. 2021-047525, filed on Mar. 22, 2021, the content of which is hereby incorporated by reference into this application.

BACKGROUND OF THE INVENTION

The present invention relates to the configurations of drive circuits for controlling the drives of power conversion devices, and, in particular, relates to a technology that can be effectively applied to the upper arm drive circuit of a power conversion device.

Along with the worldwide increasing awareness about environmental conservation, energy saving is more severely required, so that power conversion devices (inverters) have been adopted widely in various fields. And power conversion devices installed in the drive systems of railroad vehicles, air conditioners, and the like are faced with an important challenge in that how the power conversion devices can be made highly sophisticated and effective as well as how the power conversion devices can be made highly reliable.

A typical power conversion device includes a bridge circuit having an upper arm and a lower arm each of which is composed of a switching element and a free-wheeling diode connected to the switching element in antiparallel, and further includes an upper arm drive circuit for controlling the drive of the switching element of the upper arm and a lower arm drive circuit for controlling of the drive of the switching element of the lower arm.

As one of the background technologies in this technological field, there is a technology disclosed in Japanese Unexamined Patent Application Publication No. Hei 8-88550, for example. Japanese Unexamined Patent Application Publication No. Hei 8-88550 discloses a circuit configuration in which, a MOSFET for shunting the gate of an IGBT is connected between the gate and the emitter of the IGBT and a capacitor is connected between the gate of the MOSFET and the collector of the IGBT, and when a voltage with a very large time variation (dV/dt) is applied to the relevant power conversion device, the MOSFET for shunting the gate of the IGBT is turned ON, so that the malfunction of the power conversion device is prevented (the paragraph [0017], etc. in Japanese Unexamined Patent Application Publication No. Hei 8-88550).

In addition, Japanese Unexamined Patent Application Publication No. 2005-51821 discloses a circuit configuration in which pulse signals that respectively appear across a load resistor 3 of a MOSFET 1 and a load resistor 4 of a MOSFET 2 at the same time such as noises caused by a voltage with a very large time variation (dV/dt) are considered noises and invalidated, so that the malfunctions of an RS latch 15 and an output IGBT are prevented (the paragraph [0023], etc. in Japanese Unexamined Patent Application Publication No. 2005-51821).

SUMMARY OF THE INVENTION

However, in a typical power conversion device as mentioned above, the reference potential of an upper arm drive circuit for controlling the drive of the switching element of an upper arm is usually connected to the GND (the ground potential), so that, if the potential of the inverter output of the power conversion device becomes negative (minus), a voltage equal to or smaller than the reference potential is applied to the upper arm drive circuit, which leads to the malfunction of the upper arm drive circuit due to a reverse current or the like in some cases.

In IGBT drive circuits described in Japanese Unexamined Patent Application Publication No. Hei 8-88550 and Japanese Unexamined Patent Application Publication No. 2005-51821, the GND (the ground potential) is used as the reference potentials of the IGBT drive circuits, and problems that arise when the output potential becomes negative (minus) and means for solving the problems are not described.

Therefore, an object of the present invention is to provide an upper arm drive circuit that can perform stable control of an upper arm without malfunctioning in a power conversion device including a bridge circuit composed of an upper arm and a lower arm even if the output of a power conversion device becomes a negative potential.

In order to solve the abovementioned problems, the present invention proposes an upper arm drive circuit for controlling the drive of an upper arm switching element of a power conversion device. The upper arm drive circuit is characterized by including: an upper arm gate voltage output wiring connected to a gate of the upper arm switching element; a first upper arm drive circuit reference potential wiring; an upper arm gate voltage reference potential wiring connected to an inverter output of the power conversion device; and a control circuit of upper arm drive circuit reference potential wiring potential for controlling the potential of the first upper arm drive circuit reference potential wiring to a potential lower than a reference potential when a potential of the inverter output is equal to a predefined potential that is lower than the reference potential or lower, in which the first upper arm drive circuit reference potential wiring is connected to the reference potential via the control circuit of upper arm drive circuit reference potential wiring potential.

According to the present invention, in a power conversion device including a bridge circuit composed of an upper arm and a lower arm, an upper arm drive circuit capable of performing stable control of the upper arm without malfunctioning even if the output of the power conversion device becomes a negative potential can be realized.

With this, the power conversion device (inverter) can be made highly reliable.

Problems, configurations, and advantageous effects other than the above will be explicitly shown by the descriptions of the following embodiments.

DETAILED DESCRIPTION OF THE PREFERRED EMBODIMENTS

Hereinafter, the embodiments of the present invention will be described with reference to the accompanying drawings. Here, in the following drawings, the same components are given the same reference signs, and detailed explanations about redundant parts will be omitted.

First Embodiment

Figure 1A:
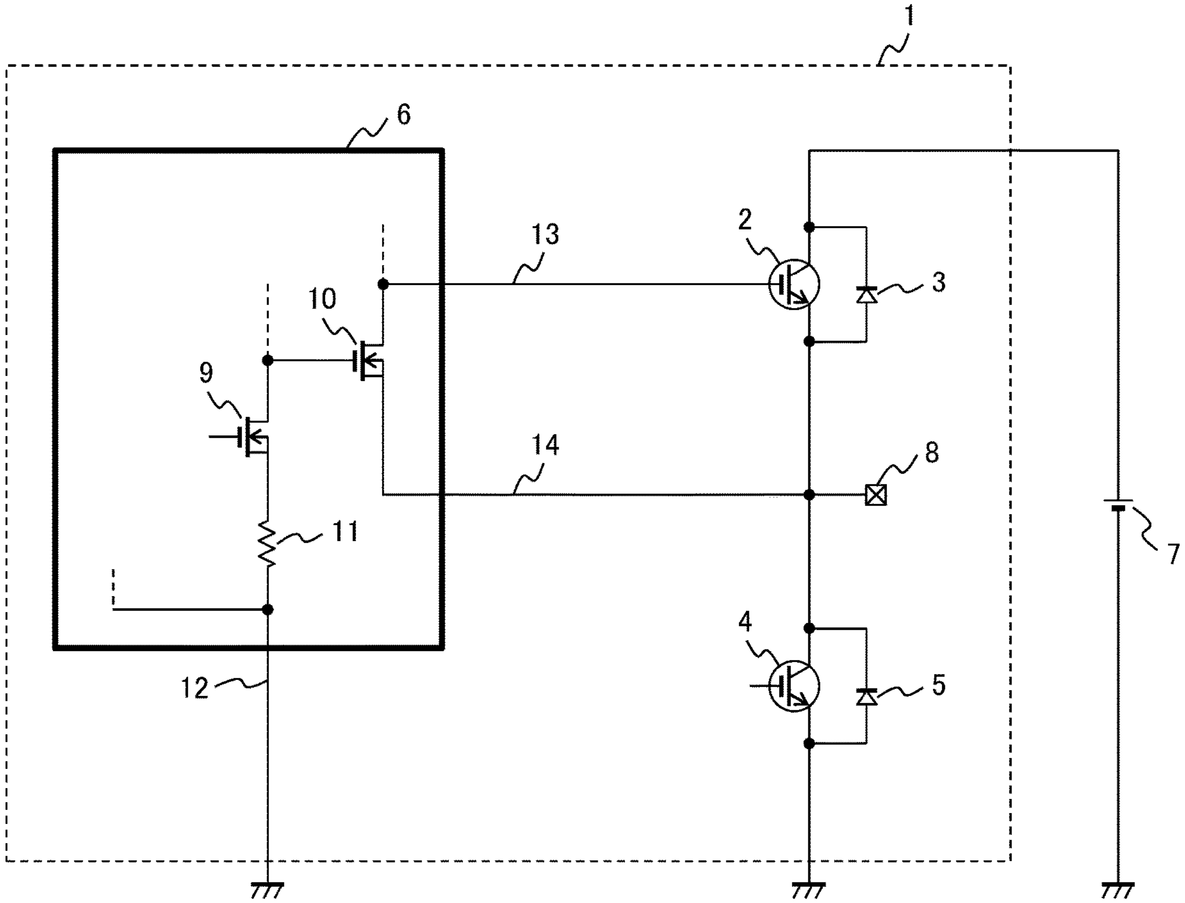
FIG. 1A is a diagram showing a schematic configuration of a conventional power conversion device (a first conventional technology)
Figure 1B:
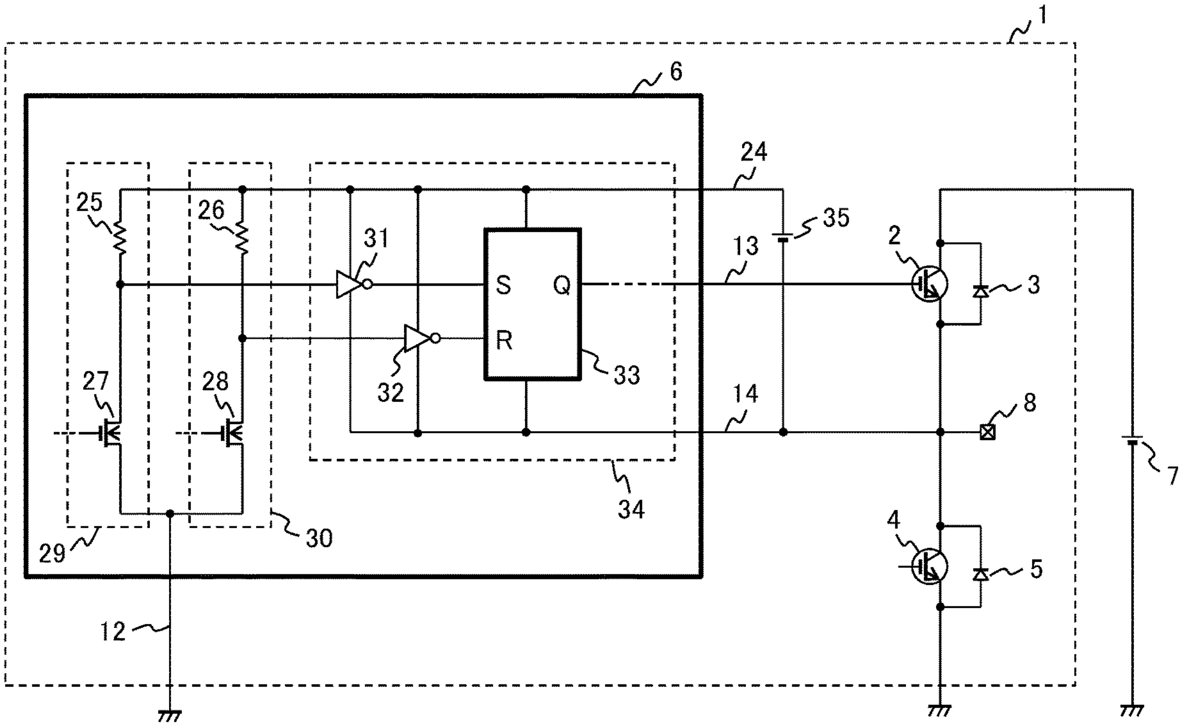
FIG. 1B is a diagram showing a schematic configuration of a conventional power conversion device (a second conventional technology)

First, problems about the abovementioned conventional power conversion devices will be explained in detail with reference to FIG. 1A and FIG. 1B. FIG. 1A and FIG. 1B are diagrams showing schematic configurations of conventional power conversion devices, and respectively show the configurations of power conversion devices according to Japanese Unexamined Patent Application Publication Nos. Hei 8-88550 and 2005-51821.

Here, the depiction of a lower arm drive circuit is omitted in each of drawings to be explained later.

In addition, although, in the following explanations, an example of a half-bridge circuit including only one leg having an upper arm and a lower arm each of which is composed of a switching element and a free-wheeling diode connected to the switching element in antiparallel will be explained as a configuration of the power conversion device (inverter), the present invention is not limited to this half-bridge circuit, and the present invention can be applied to a full-bridge circuit that is formed by connecting one leg of a half-bridge circuit to another half-bridge circuit, or can also be applied to a power conversion device equipped with a three-phase full-bridge circuit that is formed by connecting another leg to a full-bridge circuit.

First Conventional Technology

In a power conversion device 1 disclosed in Japanese Unexamined Patent Application Publication No. Hei 8-88550, as shown in FIG. 1A, DC power supplied from a high voltage power supply 7 is converted into AC power by an upper arm composed of an upper arm IGBT 2 and an upper arm free-wheeling diode 3 and a lower arm composed of a lower arm IGBT 4 and a lower arm free-wheeling diode 5, and the AC power is outputted to an inverter output 8. The upper arm IGBT 2 is connected to an upper arm drive circuit 6 and the drive of the upper arm IGBT 2 is controlled by the upper arm drive circuit 6.

The gate of the upper arm IGBT 2 is connected to the drain of an upper arm drive MOSFET 10 of the upper arm drive circuit 6 via an upper arm gate voltage output wiring 13, and the source of the upper arm drive MOSFET 10 is connected to the inverter output 8 via an upper arm gate voltage reference potential wiring 14.

The gate of the upper arm drive MOSFET 10 is connected to the drain of an upper arm drive MOSFET 9, and the source of the upper arm drive MOSFET 9 is connected to the GND (the ground potential) via a resistor 11 and an upper arm drive circuit reference potential wiring 12.

Note that the upper arm drive circuit reference potential wiring 12 is connected to the GND, so that, because a voltage equal to or smaller than a reference potential is applied to the upper arm drive circuit 6 when the potential of the inverter output 8 becomes negative (minus), the upper arm drive circuit 6 may malfunction due to a reverse current or the like.

This malfunction will be explained in detail below. The upper arm drive MOSFET 10 is a MOSFET for turning the upper arm IGBT 2 OFF, and the upper arm drive MOSFET 10 is turned ON only when the upper arm IGBT 2 is OFF. When the upper arm IGBT 2 is ON, the upper arm drive MOSFET 10 needs to be OFF. Therefore, an upper arm Drive MOSFET 9 is turned ON to discharge the charge of the gate of the upper arm drive MOSFET 10, so that the gate potential of the upper arm drive MOSFET 10 is lowered and a voltage between the gate and the source of the upper arm Drive MOSFET 10 is set equal to 0 V or lower.

However, if the potential of the inverter output 8 becomes minus, it is impossible to set the gate potential of the upper arm drive MOSFET 10 to 0 V or lower even if the upper arm drive MOSFET 9 is on an ON state, so that a positive voltage is applied between the gate and the source of the upper arm Drive MOSFET 10 and the upper arm Drive MOSFET 10 is turned ON (the upper arm Drive MOSFET 10 malfunctions) in some cases.

Second Conventional Technology

As shown in FIG. 1B, in a conventional power conversion device 1 disclosed by Japanese Unexamined Patent Application Publication No. 2005-51821, DC power provided from a high voltage power supply 7 is converted into AC power by an upper arm composed of an upper arm IGBT 2 and an upper arm free-wheeling diode 3 and a lower arm composed of a lower arm IGBT 4 and a lower arm free-wheeling diode 5, and the AC power is outputted to an inverter output 8. The upper arm IGBT 2 is connected to the upper arm drive circuit 6, and the drive of the upper arm IGBT 2 is controlled by the upper arm drive circuit 6.

The upper arm drive circuit 6 includes: a level shift circuit for set signal transmission 29 composed of a resistor 25 and a MOSFET 27; a level shift circuit 30 for reset signal transmission composed of a resistor 26 and a MOSFET 28; and a high-side section circuit 34 composed of a NOT circuit 31, a NOT circuit 32, and an RS flip-flop 33.

The gate of the upper arm IGBT 2 is connected to the Q terminal of the RS flip-flop of the upper arm drive circuit 6 via an upper arm gate voltage output wiring 13, and the NOT circuits 31, 32, the RS flip-flop 33, and a high-side circuit power supply 35 are connected to the inverter output 8 via an upper arm gate voltage reference potential wiring 14.

Both the source of the MOSFET 27 and the source of the MOSFET 28 are connected to the GND (the ground potential) via an upper arm drive circuit reference potential wiring 12.

DC power is provided from the high-side circuit power supply 35 to a terminal connected to the resistor 25 of the level shift circuit for set signal transmission 29; a terminal connected to the resistor 26 of the level shift circuit 30 for reset signal transmission; the NOT circuits 31 and 32 of the high-side section circuit 34; and the RS flip-flop 33 via an upper arm drive circuit power supply wiring 24 and the upper arm gate voltage reference potential wiring 14.

The fundamental behavior of the circuit of this power conversion device 1 will be explained below. When the upper arm IGBT 2 is turned ON, a set signal is transmitted to the S terminal of the RS flip-flop 33 via the level shift circuit for set signal transmission 29 and the NOT circuit 31. The RS flip-flop 33 holds the set signal, so that the upper arm IGBT 2 is turned ON.

The RS flip-flop 33 holds the set signal until a reset signal is transmitted to the RS flip-flop 33. During this period, the upper arm IGBT 2 continues to be ON.

When the upper arm IGBT 2 is turned OFF, the reset signal is transmitted to the R terminal of the RS flip-flop 33 via the level shift circuit 30 for reset signal transmission and the NOT circuit 32. The RS flip-flop 33 holds the reset signal, so that the upper arm IGBT 2 is turned OFF.

The RS flip-flop 33 holds the reset signal until the set signal is transmitted to the RS flip-flop 33. During this period, the upper arm IGBT 2 continues to be OFF.

Even in the circuit configuration of this power conversion device 1, there is a possibility that the upper arm dive circuit 6 malfunctions when the potential of the inverter output 8 becomes negative (minus).

As a concrete example of the malfunctions, there may be the case where, if the potential of the inverter output 8 becomes minus, the set signal cannot be transmitted from the level shift circuit for set signal transmission 29 to the NOT circuit 31 when the set signal should be transmitted.

This is because, even if the level shift circuit for set signal transmission 29 outputs an "L" signal, the potential of the inverter 8, which is a reference potential for the NOT circuit 31, is lower than the "L" signal, so that the "L" signal cannot be recognized to be "L".

Furthermore, as another concrete example of the malfunctions, there may be the case where, if the potential of the inverter output 8 becomes a minus potential the absolute value of which is very large and the potential of the upper arm drive circuit power supply wiring 24 is also becomes minus, a reverse current, which flows from the GND to the upper arm drive circuit power supply wiring 24 via the upper arm drive circuit reference potential wiring 12 and the level shift circuit for set signal transmission 29 or the level shift circuit 30 for reset signal transmission, occurs, so that the circuit of the power conversion device 1 may become abnormal and malfunction.

Figure 2A:
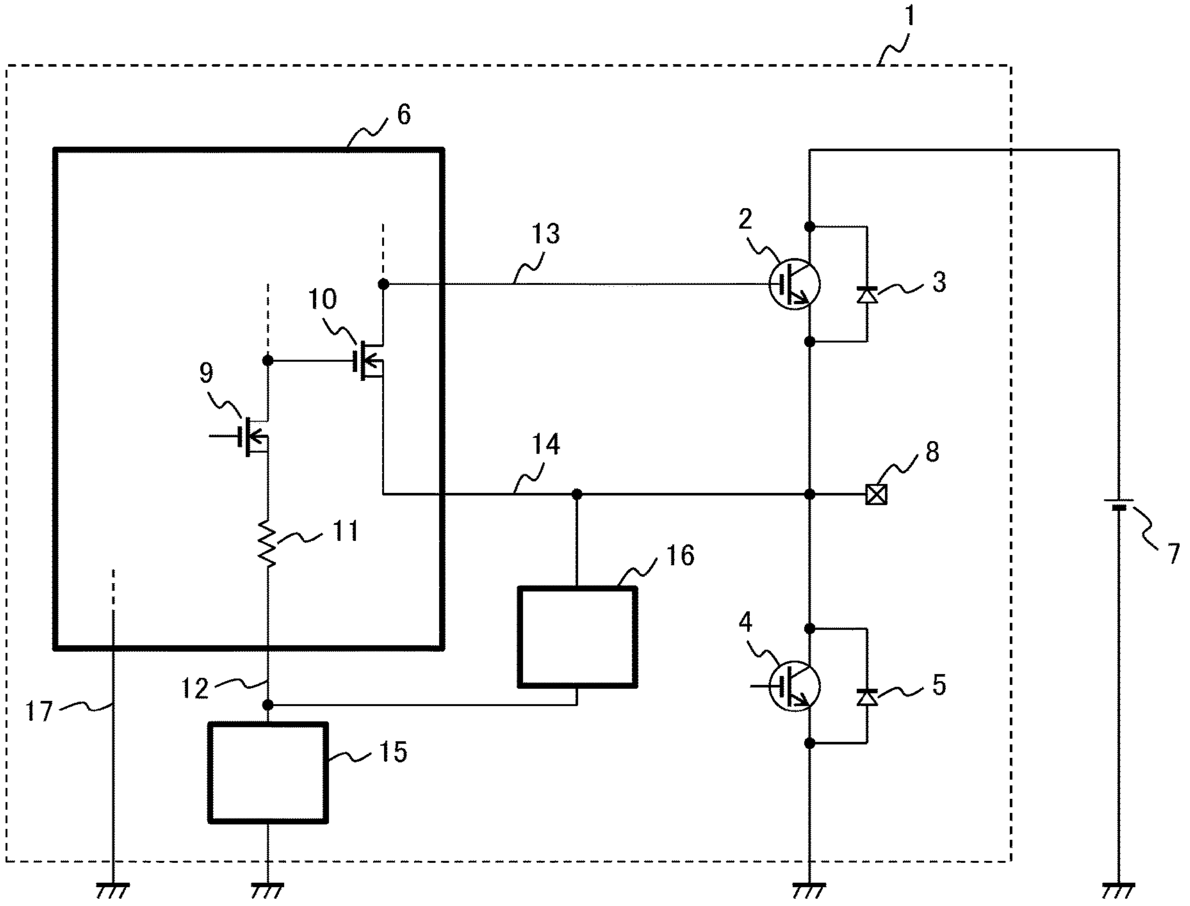
FIG. 2A is a diagram showing a schematic configuration of a power conversion device according to a first embodiment of the present invention.
Figure 2B:
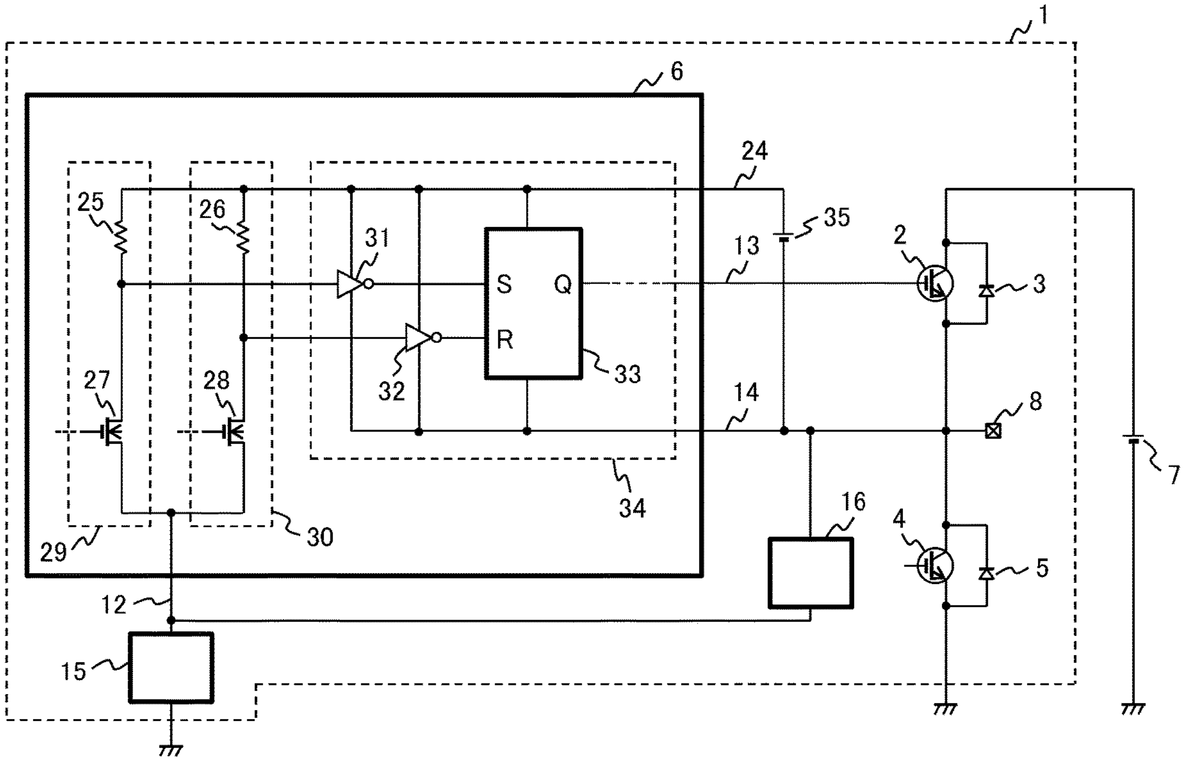
FIG. 2B is a diagram showing a modification of the power conversion device shown in FIG. 2A (a first modification)

Next, a power conversion device and an upper arm drive circuit according to a first embodiment of the present invention will be explained with reference to FIG. 2A to FIG. 2C. FIG. 2A is a diagram showing a schematic configuration of a power conversion device 1 according to this embodiment. FIG. 2B shows a modification (a first modification) of the power conversion device 1 shown in FIG. 2A, and FIG. 2C shows a modification (a second modification) of the power conversion device shown in FIG. 2B.

Figure 2C:
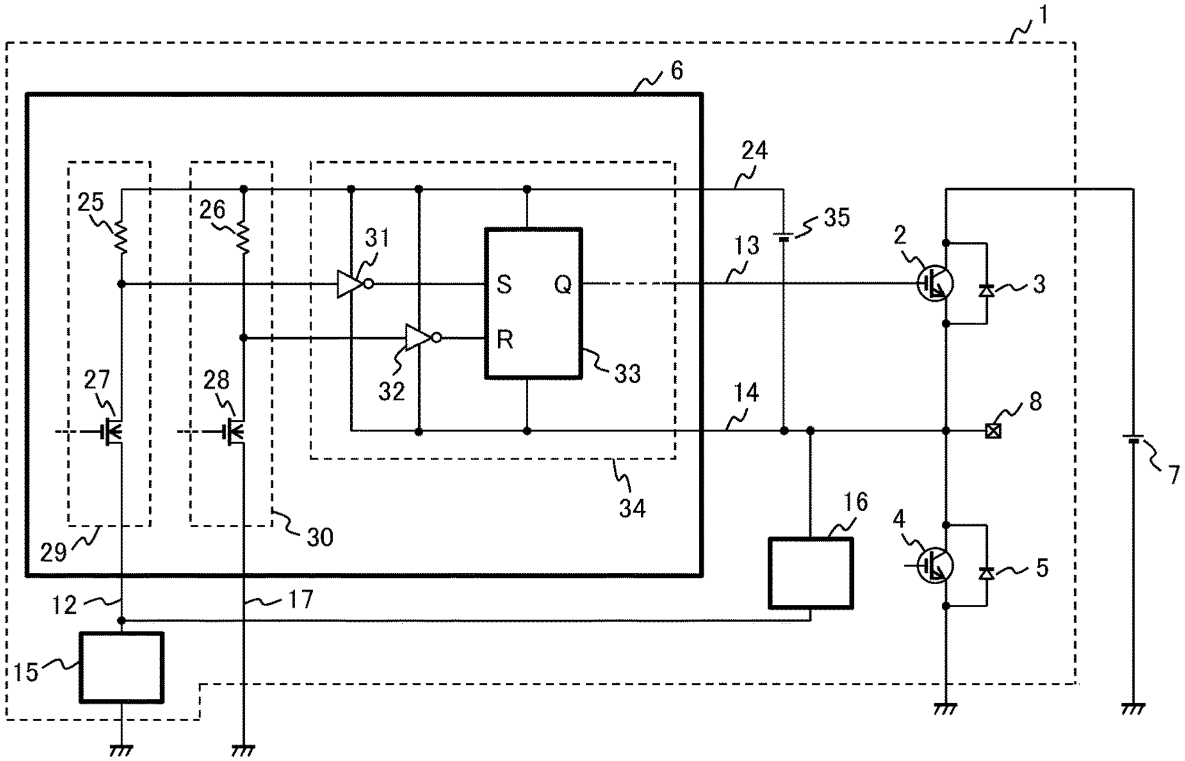
FIG. 2C is a diagram showing a modification of the power conversion device shown in FIG. 2B (a second modification)

Here, FIG. 2A shows a configuration example obtained by applying the present invention to the upper arm drive circuit of the above-described first conventional technology (FIG. 1A), and FIG. 2B and FIG. 2C show two examples obtained by applying the present invention to the upper arm drive circuit of the above-described second conventional technology (FIG. 1B).

As shown in FIG. 2A, the power conversion device 1 according to this embodiment converts DC power supplied from a high voltage power supply 7 into AC power using an upper arm composed of an upper arm IGBT 2, which is a switching element, and an upper arm free-wheeling diode 3 and a lower arm composed of a lower arm IGBT 4, which is a switching element, and a lower arm free-wheeling diode 5, and outputs the AC power to an inverter output 8. The upper arm IGBT 2 is connected to the upper arm drive circuit 6, and the drive of the upper arm IGBT 2 is controlled by the upper arm drive circuit 6.

The gate of the upper arm IGBT 2 is connected to the drain of an upper arm drive MOSFET 10 of the upper arm drive circuit 6 via an upper arm gate voltage output wiring 13, and the source of the upper arm drive MOSFET 10 is connected to the inverter output 8 via an upper arm gate voltage reference potential wiring 14.

The gate of the upper arm drive MOSFET 10 is connected to the drain of an upper arm drive MOSFET 9, and the source of the upper arm drive MOSFET 9 is connected to the GND (the ground potential), which is a reference potential, via a resistor 11, an upper arm drive circuit reference potential wiring 12, and a reference potential wiring GND connection section 15. In addition, the upper arm drive circuit 6 is connected to the GND (the ground potential) via an upper arm drive circuit reference potential wiring 17 that is different from the upper arm drive circuit reference potential wiring 12.

The upper arm gate voltage reference potential wiring 14 is connected to the upper arm drive circuit reference potential wiring 12 via a reference potential wiring inverter output connection section 16.

Here, in this embodiment, the upper arm drive circuit reference potential wiring 12 is connected to the reference potential wiring GND connection section 15 and the reference potential wiring inverter output connection section 16.

Therefore, in a normal state where the potential of the inverter output 8 is 0 V or larger, the potential of the upper arm drive circuit reference potential wiring 12 is set equal to or higher than the reference potential, for example, almost equal to the GND by the reference potential wiring GND connection section 15.

Furthermore, when the potential of the inverter output 8 is equal to or lower than a predefined potential lower than the reference potential, for example, a minus potential, the potential of the upper arm drive circuit reference potential wiring 12 is set lower than the reference potential, for example, almost equal to the potential of the inverter output 8 by the reference potential wiring inverter output connection section 16.

In other words, by configuring a control circuit of upper arm drive circuit reference potential wiring potential with the reference potential wiring GND connection section 15 and the reference potential wiring inverter output connection section 16, and further by connecting the upper arm drive circuit reference potential wiring 12 to the reference potential via the control circuit of upper arm drive circuit reference potential wiring potential (the reference potential wiring GND connection section 15), the control circuit of upper arm drive circuit reference potential wiring potential controls the potential of the upper arm drive circuit reference potential wiring 12 to a potential lower than the reference potential when the potential of the inverter output 8 is equal to or lower than the predefined potential lower than the reference potential.

With the abovementioned behavior, the malfunction of the upper arm drive circuit 6 that may occur when the potential of the inverter output 8 is minus can be prevented.

Here, in the example shown in FIG. 2A, although an upper arm drive circuit reference potential wiring of the upper arm drive circuit 6 is divided into the upper arm drive circuit reference potential wiring 12 (a first upper arm drive circuit reference potential wiring) and the upper arm drive circuit reference potential wiring 17 (a second upper arm drive circuit reference potential wiring), and only the upper arm drive circuit reference potential wiring 12 is connected to the reference potential wiring GND connection section 15 and the reference potential wiring inverter output connection section 16, it is conceivable that, without the upper arm drive circuit reference potential wiring being divided, the upper arm drive circuit reference potential wiring 12 and the upper arm drive circuit reference potential wiring 17 are configured to be integrated into one upper arm drive circuit reference potential wiring, and the one upper arm drive circuit reference potential wiring is connected to the reference potential wiring GND connection section 15 and the reference potential wiring inverter output connection section 16.

First Modification

A modification of the power conversion device shown in FIG. 2A will be explained with reference to FIG. 2B.

Here, the configuration of the upper arm drive circuit 6 shown in FIG. 2B is the same configuration of the upper arm drive circuit 6 explained in the second conventional technology (FIG. 1B), so detailed explanation for the upper arm drive circuit 6 shown in FIG. 2B will be omitted.

In the power conversion device 1 shown in FIG. 2B, an upper arm drive circuit reference potential wiring connected to a level shift circuit for set signal transmission 29 and an upper arm drive circuit reference potential wiring connected to a level shift circuit 30 for reset signal transmission are not connected to the GND separately, but these two upper arm drive circuit reference potential wirings are configured to be integrated into one upper arm drive circuit reference potential wiring 12, and this upper arm drive circuit reference potential wiring 12 is connected to a reference potential wiring GND connection section 15 and a reference potential wiring inverter output connection section 16.

With this, when the potential of an inverter output 8 becomes minus, the reference potentials of the level shift circuit for set signal transmission 29 and the level shift circuit 30 for reset signal transmission become almost equal to the potential of the inverter output 8, and the malfunctions that occur in the second conventional technology can be prevented.

Second Modification

A modification of the power conversion device shown in FIG. 2B will be explained with reference to FIG. 2C.

In the power conversion device 1 shown in FIG. 2B, the upper arm drive circuit reference potential wiring connected to the level shift circuit for set signal transmission 29 and the upper arm drive circuit reference potential wiring connected to the level shift circuit 30 for reset signal transmission are not prepared separately, but configured to be integrated into the one upper arm drive circuit reference potential wiring 12, while, in the power conversion device 1 shown in FIG. 2C, an upper arm drive circuit reference potential wiring 12 connected to a level shift circuit for set signal transmission 29 and an upper arm drive circuit reference potential wiring 17 connected to a level shift circuit 30 for reset signal transmission are configured to be provided individually.

And the upper arm drive circuit reference potential wiring 12 connected to the level shift circuit for set signal transmission 29 is connected to a reference potential wiring GND connection section 15 and the reference potential wiring inverter output connection section 16.

When the potential of an inverter output 8 becomes minus, an upper arm IGBT 2 is usually OFF.

Therefore, a signal to be transmitted next is a set signal, and all that is required is to prevent the malfunction of the level shift circuit for set signal transmission 29 from occurring, so that the upper arm drive circuit reference potential wiring 17 connected to the level shift circuit 30 for reset signal transmission level is directly connected to the GND, and by connecting only the upper arm drive circuit reference potential wiring 12 connected to the level shift circuit for set signal transmission 29 to the reference potential wiring GND connection section 15 and the reference potential wiring inverter output connection section 16, the potential of the upper arm drive circuit reference potential wiring 12 is set almost equal to the potential of the inverter output 8, which prevents the malfunction of the level shift circuit for set signal transmission 29.

Second Embodiment

Figure 3:
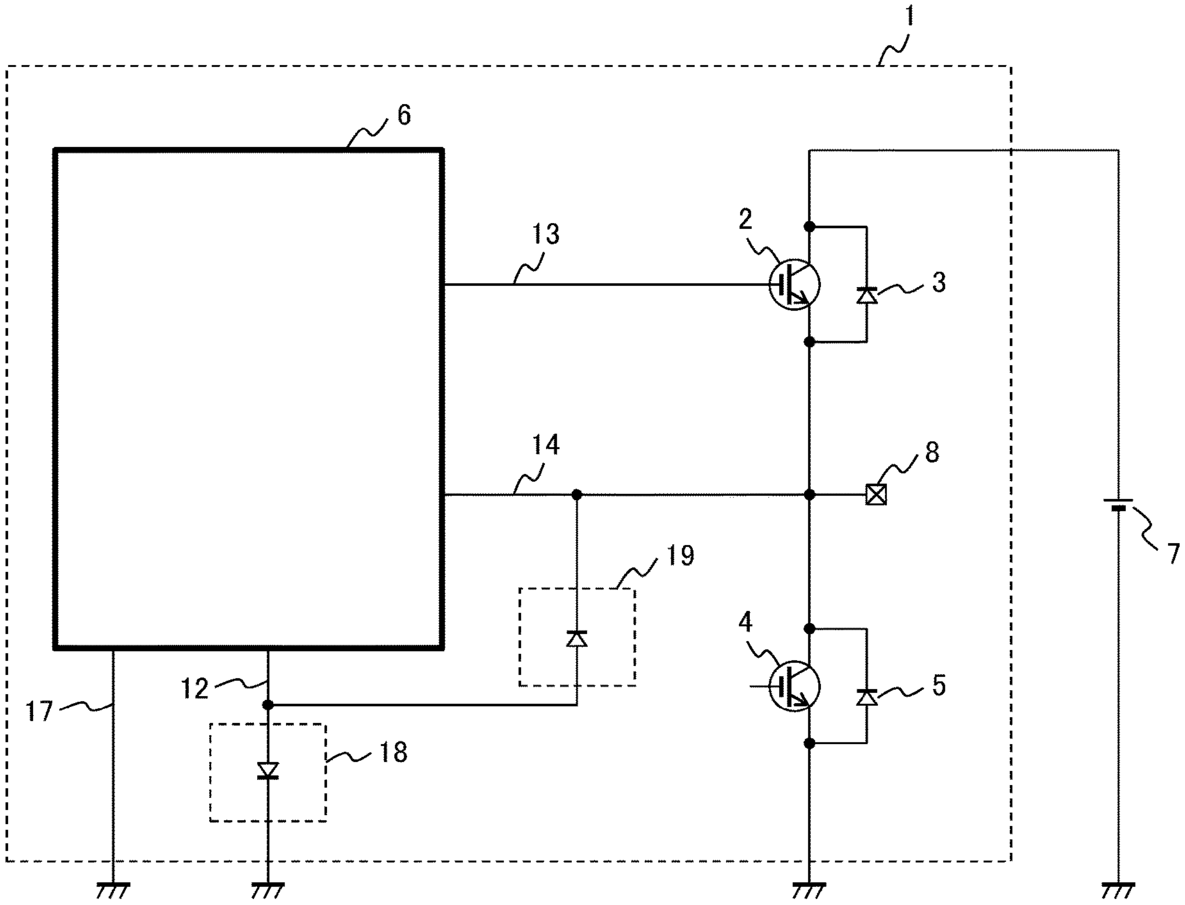
FIG. 3 is a diagram showing a schematic configuration of a power conversion device according to a second embodiment of the present invention.

A power conversion device and an upper arm drive circuit according to a second embodiment of the present invention will be explained with reference to FIG. 3. FIG. 3 is a diagram showing a schematic configuration of the power conversion device 1 according to this embodiment.

Here, since the configuration of the upper arm drive circuit 6 shown in FIG. 3 is the same as that of the first embodiment (FIG. 2A), the depiction and detailed explanation of the upper arm drive circuit 6 will be omitted.

As shown in FIG. 3, in the power conversion device 1 according to this embodiment, a reference potential wiring GND connection section 18 is composed of a diode and a reference potential wiring inverter output connection section 19 is also composed of a diode.

To put it concretely, in this embodiment, a control circuit of upper arm drive circuit reference potential wiring potential is configured to include a first diode (18) the cathode of which is connected to a reference potential and the anode of which is connected to an upper arm drive circuit reference potential wiring 12 and a second diode (19) the cathode of which is connected to an upper arm gate voltage reference potential wiring 14 and the anode of which is connected to the upper arm drive circuit reference potential wiring 12.

With this configuration, when the potential of an inverter output 8 is 0 V or larger, the potential of the upper arm drive circuit reference potential wiring 12 becomes almost equal to the GND (in this embodiment, the potential is a little higher than the reference potential by the threshold value of the diode), and when the potential of an inverter output is minus, the potential of the upper arm drive circuit reference potential wiring 12 becomes almost equal to the potential of the inverter output 8 (in this embodiment, the potential becomes a little higher than the potential of the inverter output 8 by the threshold value of the diode). With this, the upper arm drive circuit 6 is prevented from malfunctioning.

Now, although the diodes are used in the reference potential wiring GND connection section 18 and the reference potential wiring inverter output connection section 19 in this embodiment, the diodes can be replaced with elements or circuits as long as each of the elements or the circuits acts as a rectifier for allowing current to flow in one direction.

Third Embodiment

Figure 4:
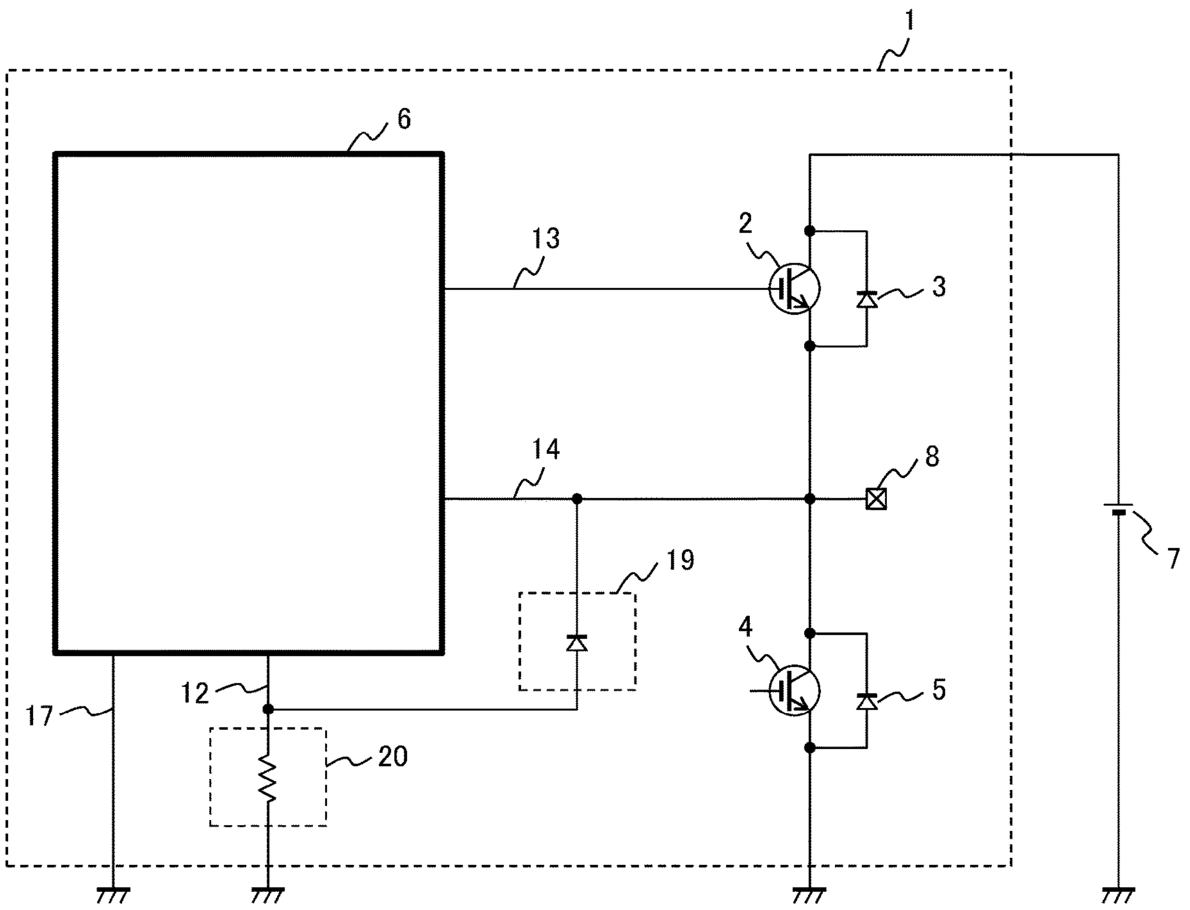
FIG. 4 is a diagram showing a schematic configuration of a power conversion device according to a third embodiment of the present invention.

A power conversion device and an upper arm drive circuit according to a third embodiment of the present invention will be explained with reference to FIG. 4. FIG. 4 is a diagram showing a schematic configuration of the power conversion device 1 according to this embodiment.

Here, since the configuration of the upper arm drive circuit 6 shown in FIG. 4 is the same as that of the first embodiment (FIG. 2A), the depiction and detailed explanation of the upper arm drive circuit 6 will be omitted.

As shown in FIG. 4, in the power conversion device 1 according to this embodiment, a reference potential wiring GND connection section 20 is composed of a resistor and a reference potential wiring inverter output connection section 19 is composed of a diode.

To put it concretely, in this embodiment, a control circuit of upper arm drive circuit reference potential wiring potential is configured to include a resistor (20) one end of which is connected to a reference potential and the other end of which is connected to an upper arm drive circuit reference potential wiring 12 and a diode (19) the cathode of which is connected to an upper arm gate voltage reference potential wiring 14 and the anode of which is connected to the upper arm drive circuit reference potential wiring 12.

When the potential of an inverter output 8 is 0 V or larger, current flows from the upper arm drive circuit 6 to the resistor of a reference potential wiring GND connection section 20. If a voltage drop across the resistor is set small by suppressing the value of this current or other means, the potential of the upper arm drive circuit reference potential wiring 12 becomes almost equal to the GND.

When the potential of the inverter output 8 is minus, the potential of the upper arm drive circuit reference potential wiring 12 becomes almost equal to the potential of the inverter output 8 due to the action of the diode of the reference potential wiring inverter output connection section 19.

With this, the upper arm drive circuit 6 is prevented from malfunctioning.

Fourth Embodiment

Figure 5:
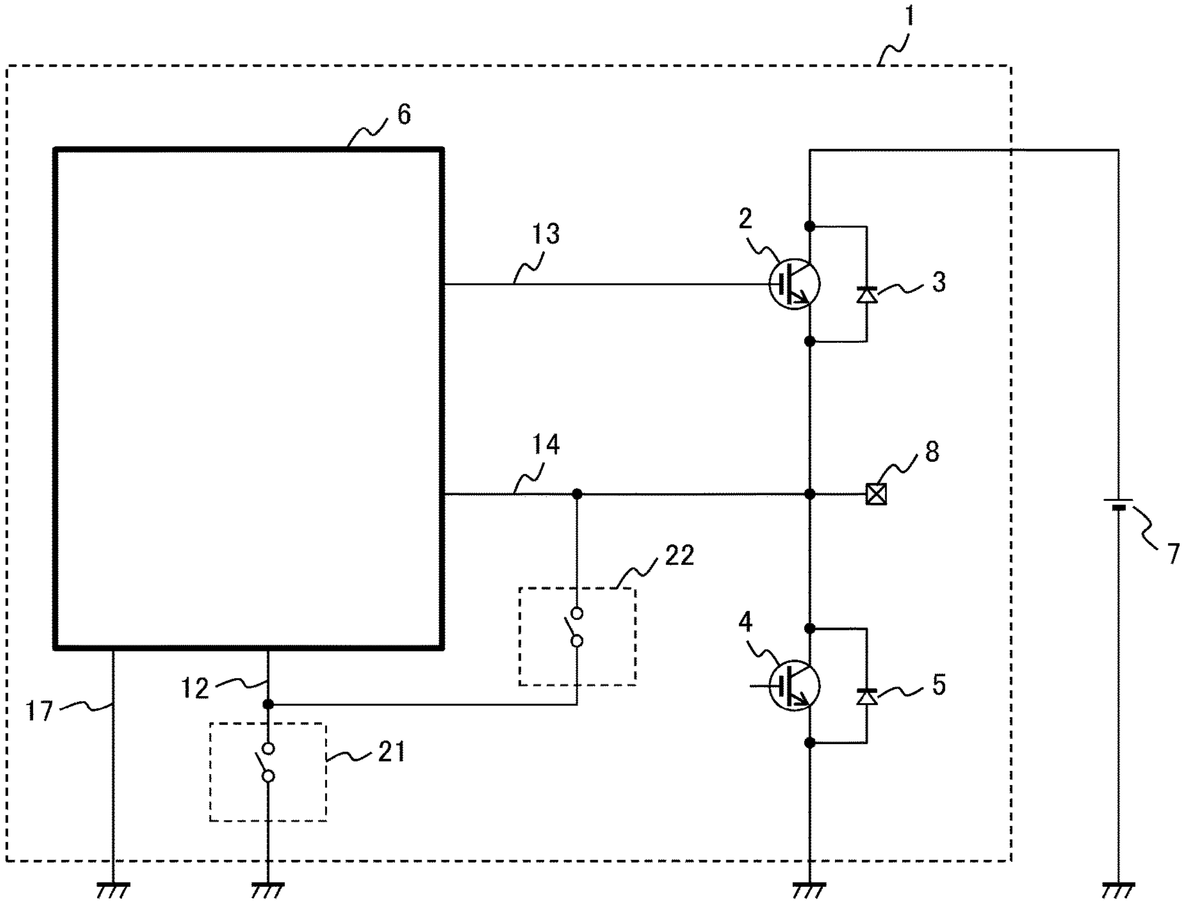
FIG. 5 is a diagram showing a schematic configuration of a power conversion device according to a fourth embodiment of the present invention.

A power conversion device and an upper arm drive circuit according to a fourth embodiment of the present invention will be explained with reference to FIG. 5. FIG. 5 is a diagram showing a schematic configuration of the power conversion device 1 according to this embodiment.

Here, since the configuration of the upper arm drive circuit 6 shown in FIG. 5 is the same as that of the first embodiment (FIG. 2A), the depiction and detailed explanation of the upper arm drive circuit 6 will be omitted.

As shown in FIG. 5, in the power conversion device 1 according to this embodiment, a reference potential wiring GND connection section 21 is composed of a switch and a reference potential wiring inverter output connection section 22 is also composed of a switch.

These switches may be mechanical switches such as relays or semiconductor switching elements.

To put it concretely, in this embodiment, a control circuit of upper arm drive circuit reference potential wiring potential is configured to include a first switch (21) one end of which is connected to a reference potential and the other end of which is connected to an upper arm drive circuit reference potential wiring 12 and a second switch (22) one end of which is connected to an upper arm gate voltage reference potential wiring 14 and the other end of which is connected to the upper arm drive circuit reference potential wiring 12.

When the potential of an inverter output 8 is 0 V or larger, the potential of the upper arm drive circuit reference potential wiring 12 is made to be almost equal to the GND (in this embodiment, equal to the reference potential) by turning the switch of the reference potential wiring GND connection section 21 ON and by turning the switch of the reference potential wiring inverter output connection section 22 OFF.

When the potential of the inverter output 8 is minus, the potential of the upper arm drive circuit reference potential wiring 12 is made to be almost equal to the potential of the inverter output 8 (in this embodiment, equal to the potential of the inverter output 8) by turning the switch of the reference potential wiring inverter output connection section 22 ON and by turning the switch of the reference potential wiring GND connection section 21 OFF.

As one of methods for realizing the above-described behavior of the upper arm drive circuit 6, there is, for example, a method in which whether the potential of the inverter output 8 is 0 V or larger or minus is detected by a circuit for detecting the potential of the inverter output 8, and the switch of the reference potential wiring GND connection section 21 and the switch of the reference potential wiring inverter output connection section 22 are controlled.

With this, the upper arm drive circuit 6 is prevented from malfunctioning.

Fifth Embodiment

Figure 6:
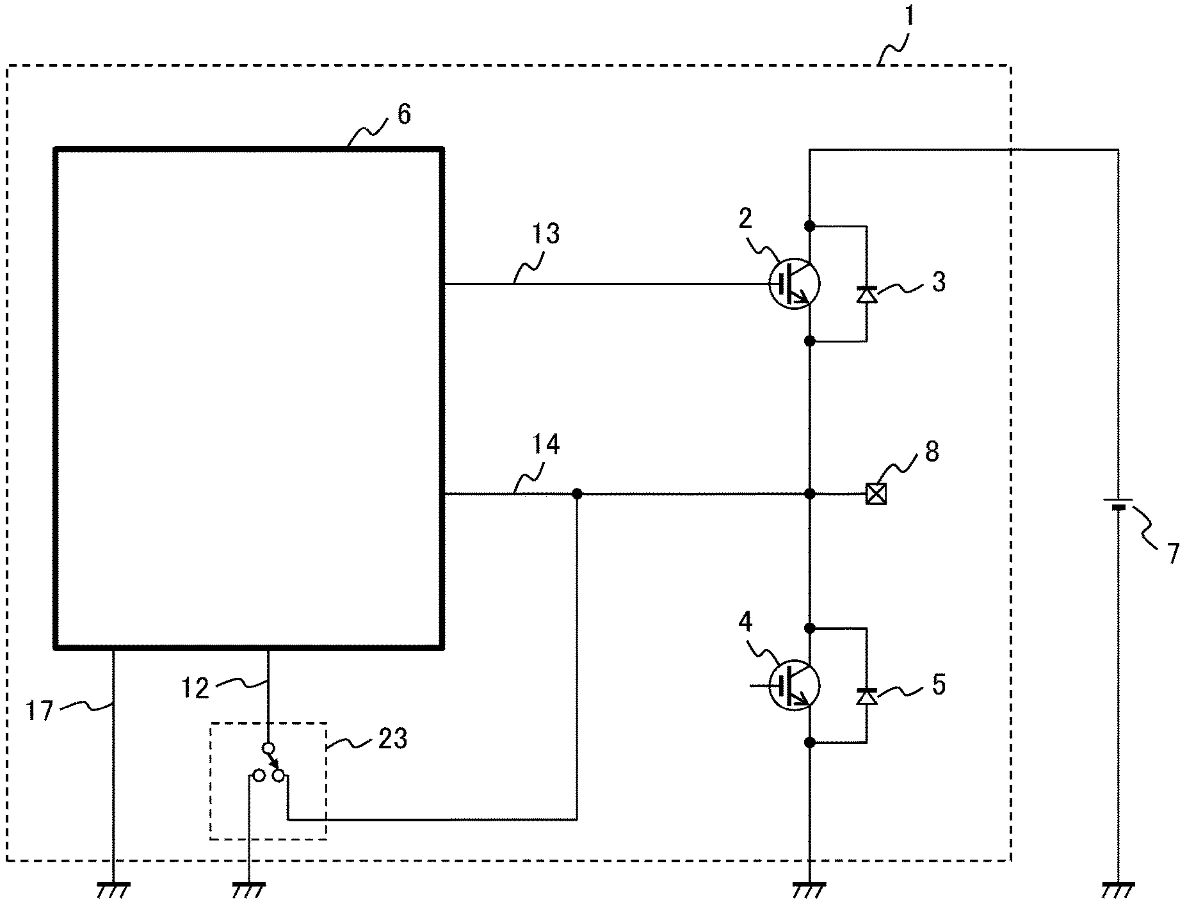
FIG. 6 is a diagram showing a schematic configuration of a power conversion device according to a fifth embodiment of the present invention.

A power conversion device and an upper arm drive circuit according to a fifth embodiment of the present invention will be explained with reference to FIG. 6. FIG. 6 is a diagram showing a schematic configuration of the power conversion device 1 according to this embodiment.

Here, since the configuration of the upper arm drive circuit 6 shown in FIG. 6 is the same as that of the first embodiment (FIG. 2A), the depiction and detailed explanation of the upper arm drive circuit 6 will be omitted.

The reference potential wiring GND connection section 21 and the reference potential wiring inverter output connection section 22 are respectively composed of individual switches in the fourth embodiment (FIG. 5), while, in the power conversion device 1 according to this embodiment, a reference potential wiring GND connection section/reference potential wiring inverter output connection section 23, which is composed of a switch including a contact referred to as a C contact or a transfer contact and integrates the actions of the reference potential wiring GND connection section 21 and the reference potential wiring inverter output connection section 22 into one action, is used.

To put it concretely, in this embodiment, a control circuit of upper arm drive circuit reference potential wiring potential is configured to include a change-over switch that changes the connection destination of an upper arm drive circuit reference potential wiring 12 from a reference potential to an upper arm gate voltage reference potential wiring 14 or vice versa.

Even in this embodiment, for example, whether the potential of an inverter output 8 is 0 V or larger or minus is detected by a circuit for detecting the potential of the inverter output 8, and then by controlling the switch of the reference potential wiring GND connection section/reference potential wiring inverter output connection section 23, it becomes possible to prevent the malfunction of the upper arm drive circuit 6.

In addition, the present invention is not limited to the above embodiment, and the present invention may include various kinds of modifications. For example, the above embodiment has been described in detail in order to explain the present invention in an easily understood manner, and the present invention is not necessarily limited to the embodiment which includes all configurations that have been described so far. Furthermore, a part of the configuration of one embodiment can be replaced with a part of the configuration of another embodiment. It is also possible to add the configuration of one embodiment to the configuration of another embodiment. In addition, a new embodiment of the present invention can be made by deleting a part of the configuration of each embodiment, by adding another configuration to a part of the configuration of each embodiment, or by replacing a part of configuration of each embodiment with another configuration.

For example, a combination of a reference potential wiring GND connection section composed of a diode as is the case with the second embodiment (FIG. 3) and a reference potential wiring inverter output connection section composed of a switch as is the case with the fourth embodiment (FIG. 5) can be thought to fall within the scope of the present invention.

Furthermore, a configuration to combine any of the upper arm drive circuits 6 explained in FIG. 2B and FIG. 2C according to the first embodiment with any of the control circuits of upper arm drive circuit reference potential wiring potential explained in the second embodiment to fifth embodiment can be thought to fall within the scope of the present invention. In addition, a configuration other than the configurations explained in FIG. 2A, FIG. 2B, and FIG. 2C can be adopted as an upper arm drive circuit.

Furthermore, the present invention can be materialized as a gate driver IC equipped with one semiconductor chip on which an upper arm drive circuit and a lower arm drive circuit are mounted. The present invention can also be applied to one chip inverter IC equipped with one semiconductor chip on which a leg composed of an upper arm and a lower arm, an upper arm drive circuit, and a lower arm drive circuit are mounted. In addition, the present invention can be applied to an inverter IC with a multi-chip configuration in which there is a combination of separate semiconductor chips on which an upper arm drive circuit and a lower arm drive circuit are mounted respectively and a leg, or can be applied to an inverter IC with a multi-chip configuration in which there is a combination of one semiconductor chip on which an upper arm drive circuit and a lower arm drive circuit are mounted and a leg.

REFERENCE SIGNS LIST

1 . . . Power Conversion Device
2 . . . Upper Arm IGBT
3 . . . Upper Arm Free-wheeling Diode
4 . . . Lower Arm IGBT
5 . . . Lower Arm Free-wheeling Diode
6 . . . Upper Arm Drive Circuit
7 . . . High Voltage Power Supply
8 . . . Inverter Output
9 . . . Upper Arm Drive MOSFET
10 . . . Upper Arm Drive MOSFET
11 . . . Resistor
12 . . . Upper Arm Drive Circuit Reference Potential Wiring
13 . . . Upper Arm Gate Voltage Output Wiring
14 . . . Upper Arm Gate Voltage Reference Voltage Wiring
15 . . . Reference Potential Wiring GND Connection Section
16 . . . Reference Potential Wiring Inverter Output Connection Section
17 . . . Upper Arm Drive Circuit Reference Potential Wiring
18 . . . Reference Potential Wiring GND Connection Section
19 . . . Reference Potential Wiring Inverter Output Connection Section
20 . . . Reference Potential Wiring GND Connection Section
21 . . . Reference Potential Wiring GND Connection Section
22 . . . Reference Potential Wiring Inverter Output Connection Section
23 . . . Reference Potential Wiring GND Connection Section/Reference Potential Wiring Inverter Output Connection Section
24 . . . Upper Arm Drive Circuit Power Supply Wiring
25, 26 . . . Resistor
27, 28 . . . MOSFET
29 . . . Level Shift Circuit for Set Signal Transmission
30 . . . Level Shift Circuit for Reset Signal Transmission
31, 32 . . . Not Circuit
33 . . . RS Flip-Flop
34 . . . High-Side Section Circuit
35 . . . High-Side Circuit Power Supply

What is claimed is:

1. An upper arm drive circuit for controlling the drive of an upper arm switching element of a power conversion device, the upper arm drive circuit comprising:

an upper arm gate voltage output wiring connected to a gate of the upper arm switching element;

a first upper arm drive circuit reference potential wiring;

an upper arm gate voltage reference potential wiring connected to an inverter output of the power conversion device; and a control circuit of upper arm drive circuit reference potential wiring potential for controlling the potential of the first upper arm drive circuit reference potential wiring to a potential lower than a reference potential when a potential of the inverter output is equal to a predefined potential that is lower than the reference potential, wherein the first upper arm drive circuit reference potential wiring is connected to the reference potential via the control circuit of upper arm drive circuit reference potential wiring potential.

2. The upper arm drive circuit according to claim 1, wherein the control circuit of upper arm drive circuit reference potential wiring potential controls the potential of the first upper arm drive circuit reference potential wiring to the reference potential or higher when the potential of the inverter output is larger than the predefined potential.

3. The upper arm drive circuit according to claim 1, wherein the control circuit of upper arm drive circuit reference potential wiring potential includes a rectifying device that allows current to flow in one direction.

4. The upper arm drive circuit according to claim 1, wherein the control circuit of upper arm drive circuit reference potential wiring potential includes:

a first diode a cathode of which is connected to the reference potential and an anode of which is connected to the first upper arm drive circuit reference potential wiring; and a second diode a cathode of which is connected to the upper arm gate voltage reference potential wiring and an anode of which is connected to the first upper arm drive circuit reference potential wiring.

5. The upper arm drive circuit according to claim 1, wherein the control circuit of upper arm drive circuit reference potential wiring potential includes:

a resistor one end of which is connected to the reference potential and another end of which is connected to the first upper arm drive circuit reference potential wiring; and a diode a cathode of which is connected to the upper arm gate voltage reference potential wiring and an anode of which is connected to the first upper arm drive circuit reference potential wiring.

6. The upper arm drive circuit according to claim 1, wherein the control circuit of upper arm drive circuit reference potential wiring potential includes:

a first switch one end of which is connected to the reference potential and another end of which is connected to the first upper arm drive circuit reference potential wiring; and a second switch one end of which is connected to the upper arm gate voltage reference potential wiring and another end of which is connected to the first upper arm drive circuit reference potential wiring.

7. The upper arm drive circuit according to claim 1, wherein the control circuit of upper arm drive circuit reference potential wiring potential includes a change-over switch that can change over from a connection between the first upper arm drive circuit reference potential wiring and the reference potential to a connection between the first upper arm drive circuit reference potential wiring and the upper arm gate voltage reference potential wiring or vice versa.

8. The upper arm drive circuit according to claim 1 further comprising a second upper arm drive circuit reference potential wiring that is connected to the reference potential and not connected to the control circuit of upper arm drive circuit reference potential wiring potential.

9. The upper arm drive circuit according to claim 8 further comprising:

a level shift circuit for set signal transmission for outputting a set signal;

a level shift circuit for reset signal transmission for outputting a reset signal; and an RS flip-flop that keeps the upper arm switching element ON by holding a set signal from the level shift circuit for set signal transmission and keeps the upper arm switching element OFF by holding a reset signal from the level shift circuit for reset signal transmission, wherein the level shift circuit for set signal transmission is connected to the first upper arm drive circuit reference potential wiring, and the level shift circuit for reset signal transmission is connected to the second upper arm drive circuit reference potential wiring.

10. The upper arm drive circuit according to claim 1 further comprising:

a first upper arm drive MOSFET a drain of which is connected to the gate of the upper arm switching element via the upper arm gate voltage output wiring and a source of which is connected to the inverter output via the upper arm gate voltage reference potential wiring; and a second upper arm drive MOSFET a drain of which is connected to a gate of the first upper arm drive MOSFET and a source of which is connected to the first upper arm drive circuit reference potential wiring via a resistor.

11. The upper arm drive circuit according to claim 1 further comprising:

a level shift circuit for set signal transmission for outputting a set signal;

a level shift circuit for reset signal transmission for outputting a reset signal; and an RS flip-flop that keeps the upper arm switching element ON by holding a set signal from the level shift circuit for set signal transmission and keeps the upper arm switching element OFF by holding a reset signal from the level shift circuit for reset signal transmission, wherein both the level shift circuit for set signal transmission and the level shift circuit for reset signal transmission are connected to the first upper arm drive circuit reference potential wiring.

12. A drive circuit of a power conversion device comprising:

an upper arm drive circuit for controlling the drive of an upper arm switching element of the power conversion device; and a lower arm drive circuit for controlling the drive of a lower arm switching element of the power conversion device, wherein the upper arm drive circuit is the upper arm drive circuit according to claim 1.

13. A power conversion device comprising:

a leg having an upper arm and a lower arm each of which is composed of a switching element and a free-wheeling diode connected to the switching element in anti-parallel;

an upper arm drive circuit for controlling the drive of the switching element of the upper arm; and a lower arm drive circuit for controlling the drive of the switching element of the lower arm;

wherein the upper arm drive circuit is the upper arm drive circuit according to claim 1.

14. The power conversion device according to claim 13, wherein the upper arm drive circuit and the lower arm drive circuit are mounted on separate semiconductor chips.

15. The power conversion device according to claim 13, wherein the upper arm drive circuit and the lower arm drive circuit are mounted on one semiconductor chip.

16. The power conversion device according to claim 13, wherein the leg, the upper arm drive circuit, and the lower arm drive circuit are mounted on one semiconductor chip.

* * * * *